(12) United States Patent
Costello et al.

(10) Patent No.: US 11,349,236 B2
(45) Date of Patent: May 31, 2022

(54) HIGH DENSITY COMMUNICATION SYSTEM

(71) Applicant: TE Connectivity Services GmbH, Schaffhausen (CH)

(72) Inventors: Brian Patrick Costello, Scotts Valley, CA (US); Nathan Lincoln Tracy, Harrisburg, PA (US); Christopher William Blackburn, Bothell, WA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 17/021,475

(22) Filed: Sep. 15, 2020

(65) Prior Publication Data

US 2022/0085532 A1  Mar. 17, 2022

(51) Int. Cl.
| | | |
|---|---|---|
| *H01R 12/72* | (2011.01) | |
| *H01R 13/6594* | (2011.01) | |
| *H01R 12/71* | (2011.01) | |
| *H01R 13/659* | (2011.01) | |
| *H01R 13/66* | (2006.01) | |

(52) U.S. Cl.
CPC ......... *H01R 12/721* (2013.01); *H01R 12/716* (2013.01); *H01R 13/659* (2013.01); *H01R 13/6594* (2013.01); *H01R 13/6658* (2013.01)

(58) Field of Classification Search
CPC .......................... H01R 12/721; H01R 12/716; H01R 13/6594; H01R 13/6658; H01R 13/659
See application file for complete search history.

(56) References Cited

U.S. PATENT DOCUMENTS

| | | | |
|---|---|---|---|
| 7,070,446 B2 | 7/2006 | Henry et al. | |
| 9,065,230 B2 | 6/2015 | Milbrand, Jr. | |
| 9,711,901 B2 * | 7/2017 | Scholeno | ............... H01R 43/26 |

* cited by examiner

*Primary Examiner* — Abdullah A Riyami
*Assistant Examiner* — Justin M Kratt

(57) ABSTRACT

A communication system includes a receptacle connector assembly including a receptacle cage and a communication connector having an inner receptacle connector and an outer receptacle connector. The communication system includes a pluggable module received in the receptacle cage to mate with the communication connector. The pluggable module includes a pluggable body defining a module cavity. The pluggable module includes a module circuit board having mating pads at a mating edge of the module circuit board plugged into the inner receptacle connector and connector pads at a mounting location remote from the mating edge. The pluggable module includes a plug connector mounted to the mounting location. The plug connector includes plug contacts extending between a plug mating end and a plug mounting end. The plug mating end is plugged into the outer receptacle connector.

21 Claims, 14 Drawing Sheets

HIGH DENSITY COMMUNICATION SYSTEM

BACKGROUND OF THE INVENTION

The subject matter herein relates generally to communication systems.

Some communication systems utilize communication connectors to interconnect various components of the system for data communication. For example, the communication connector may be surrounded by a cage to provide electrical shielding around the communication connector. Some known communication systems use pluggable modules, such as I/O modules, that are received in the cage and electrically connected to the communication connector. The pluggable modules typically include a circuit board configured to be plugged into a card slot of the communication connector. However, data throughput may be limited through the pluggable module and the communication connector. To increase data throughput, some known pluggable modules and communication connectors include double rows of contacts. However, the close proximity of the two rows of contacts leads to problems with signal integrity.

A need remains for a high density communication system.

BRIEF DESCRIPTION OF THE INVENTION

In one embodiment, a communication system is provided. The communication system includes a receptacle connector assembly including a receptacle cage configured to be mounted to a circuit board and a communication connector configured to be mounted to the circuit board, the receptacle cage having walls defining a cavity including at least one module channel. The communication connector is received in the cavity. The communication connector has an inner receptacle connector and an outer receptacle connector. The inner receptacle connector is located between the outer receptacle connector and the circuit board. The inner receptacle connector has an inner housing holding an inner contact array of inner contacts. The outer receptacle connector has an outer housing holding an outer contact array of outer contacts. The inner receptacle connector has an inner mating interface and an inner mounting interface perpendicular to the inner mating interface configured to be mounted to the circuit board. The outer receptacle connector has an outer mating interface and an outer mounting interface perpendicular to the outer mating interface configured to be mounted to the circuit board. The communication system includes a pluggable module received in the cavity of the receptacle cage to mate with the communication connector. The pluggable module includes a pluggable body extending between a cable end and a mating end rearward of the cable end. The pluggable body defines a module cavity. The pluggable module includes a module circuit board received in the module cavity. The module circuit board has mating pads at a mating edge of the module circuit board. The mating edge is plugged into the inner receptacle connector to mate the mating pads with the inner contacts of the inner receptacle connector. The module circuit board has connector pads at a mounting location remote from the mating edge. The pluggable module includes a plug connector extending between a plug mating end and a plug mounting end. The plug mounting end is mounted to the module circuit board at the mounting location. The plug connector includes plug contacts extending between the plug mating end and the plug mounting end. The plug mating end is plugged into the outer receptacle connector to mate the plug contacts with the outer contacts of the outer receptacle connector.

In another embodiment, a receptacle connector assembly is provided. The receptacle connector assembly includes a receptacle cage including a plurality of walls defining a cavity extending between a front and a rear of the receptacle cage. The walls include an inner wall and an outer wall opposite the inner wall. The walls include a first side wall and a second side wall. The inner wall is configured to be mounted to a circuit board. The receptacle connector assembly includes a communication connector received in the cavity and is configured to be mounted to the circuit board. The communication connector includes an inner receptacle connector and an outer receptacle connector. The inner receptacle connector is located between the outer receptacle connector and the circuit board. The inner receptacle connector has an inner housing holding an inner contact array of inner contacts. The inner receptacle connector has an inner mating interface and an inner mounting interface perpendicular to the inner mating interface configured to be mounted to the circuit board. The inner housing has a first slot at the first mating interface. The outer receptacle connector has an outer housing holding an outer contact array of outer contacts. The outer receptacle connector has an outer mating interface and an outer mounting interface perpendicular to the outer mating interface configured to be mounted to the circuit board. The outer housing has a second slot at the second mating interface. The inner mating interface and the outer mating interface are positioned relative to each other for mating with a common pluggable module.

In a further embodiment, a pluggable module is provided. The pluggable module includes a pluggable body extending between a cable end and a mating end rearward of the cable end. The pluggable body has a module cavity. The pluggable module includes a module circuit board received in the module cavity. The module circuit board has a first surface and a second surface extending between a cable end and a mating end rearward of the cable end. The module circuit board has a mating edge at the mating end configured to be plugged into a first slot of a communication connector. The module circuit board has mating pads at the mating edge of the module circuit board on at least one of the first surface or the second surface. The mating pads are configured to be mated with inner contacts of the communication connector when the mating edge is plugged into the first slot of the communication connector. The module circuit board has connector pads at a mounting location on the first surface remote from the mating edge. The pluggable module includes a plug connector coupled to the module circuit board. The plug connector extends between a plug mating end and a plug mounting end. The plug mounting end is mounted to the module circuit board at the mounting location. The plug connector includes plug contacts extending between the plug mating end and the plug mounting end. The plug mating end is configured to be plugged into a second slot of the communication connector to mate the plug contacts with outer contacts of the communication connector.

DETAILED DESCRIPTION OF THE INVENTION

Figure 1:
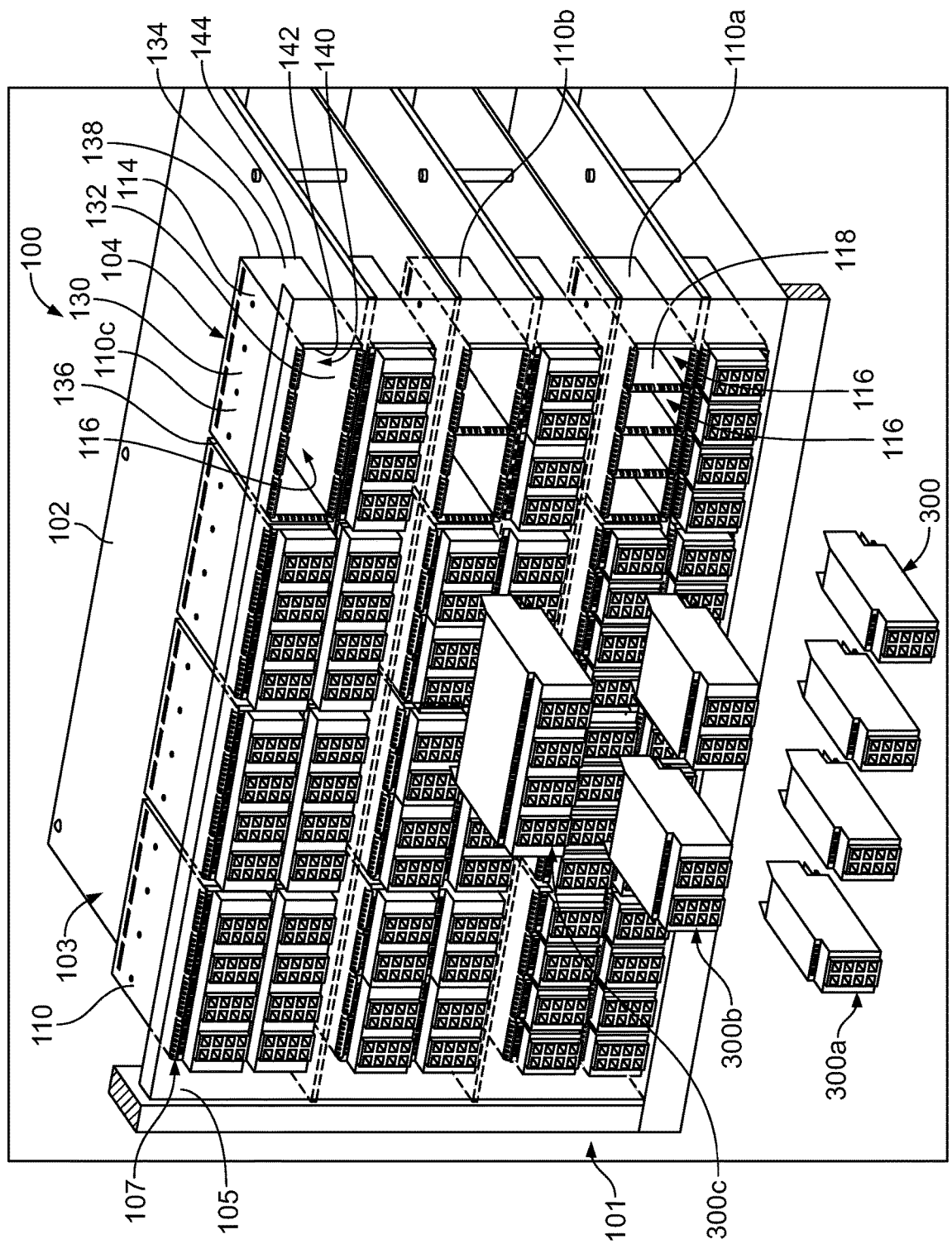
FIG. 1 is a front perspective view of a communication system formed in accordance with an exemplary embodiment.

FIG. 1 is a front perspective view of a communication system 100 formed in accordance with an exemplary embodiment. The communication system 100 includes a rack 101 holding one or more circuit board assemblies 103. Each circuit board assembly 103 includes a circuit board 102 and one or more receptacle connector assemblies 104 mounted to the circuit board 102. The receptacle connector assembly 104 is configured to receive one or more pluggable modules 300, such as I/O transceiver modules. The pluggable modules 300 are electrically connected to the circuit board 102 through the receptacle connector assembly 104. The rack 101 may be a server rack in various embodiments. The communication system 100 may include panels 105 at a front of the rack 101. The panels 105 include panel openings 107 that receive corresponding receptacle connector assemblies 104 and/or pluggable modules 300.

In the illustrated embodiment, different sized receptacle connector assemblies 104 are illustrated configured to receive different sized pluggable modules 300. For example, the communication system 100 may include single-wide pluggable modules 300a, double-wide pluggable modules 300b and quad-wide pluggable modules 300c. The various pluggable modules 300a, 300b, 300c convey different data throughput, such as 1.6 TB, 3.2 TB and 6.4 TB. The receptacle connector assemblies 104 are sized appropriately to receive the various pluggable modules 300a, 300b, 300c. In an exemplary embodiment, each circuit board assembly 103 may include multiple receptacle connector assemblies 104 arranged side-by-side on the circuit board 102 to increase the density of each circuit board assembly 104. In an exemplary embodiment, the receptacle connector assemblies 104 may be provided on both upper and lower surfaces of the circuit board 102 to increase the density of each circuit board assembly 104.

In an exemplary embodiment, the receptacle connector assembly 104 includes a receptacle cage 110 and one or more communication connectors 200 (shown in FIGS. 2 and 3) adjacent the receptacle cage 110. In the illustrated embodiment, the communication connectors 200 (shown in FIG. 2) are received in the receptacle cage 110. In other various embodiments, the communication connectors 200 may be located rearward of the receptacle cage 110. In various embodiments, the receptacle cage 110 is enclosed and provides electrical shielding for the communication connectors 200. When the pluggable modules 300 are loaded into the receptacle cage 110, the pluggable modules 300 are at least partially surrounded by the receptacle cage 110.

The receptacle cage 110 includes a plurality of walls 114 that define one or more module channels 116 for receipt of corresponding pluggable modules 300. The walls 114 may be walls defined by solid sheets. The walls 114 may be perforated walls to allow airflow therethrough. The walls 114 may have cutouts, such as for a heatsink or heat spreader to pass therethrough. In an exemplary embodiment, the receptacle cage 110 is a stamped and formed cage member with the walls 114 being shielding walls.

In an exemplary embodiment, the receptacle cages 110 of the receptacle connector assemblies 104 may be stacked adjacent each other along the upper surface of the circuit board 102 and/or along the lower surface of the circuit board 102. Various sized and shaped receptacle cages 110 may be provided to receive the various pluggable modules 300. For example, the receptacle cage 110a is sized and shaped to receive the pluggable modules 300a; the receptacle cage 110b is sized and shaped to receive the pluggable modules 300b; and the receptacle cage 110c is sized and shaped to receive the pluggable module 300c. The receptacle cage 110c has a single port that opens to a single module channel 116 that receives the single pluggable module 100c. The receptacle cages 110a, 110b have separator walls 118 that define multiple module channels 116 that receive the pluggable modules 300a, 300b, respectively. Any number of module channels 116 may be provided in various embodiments. Optionally, multiple communication connectors 104 may be arranged within the receptacle cage 110. In an exemplary embodiment, the arrangement of the communication connectors 104 may be identical within each of the receptacle cages 110a, 110b, 110c, even though the receptacle cage structures are different (for example, different numbers of separator walls 118 forming different numbers of module channels 116). In the illustrated embodiment, the receptacle cage 110a is a 4-channel cage; the receptacle cage 110b is a 2-channel cage; and the receptacle cage 110c is a 1-channel cage.

In an exemplary embodiment, the walls 114 of the receptacle cage 110 include an outer wall 130, an inner wall 132, a first side wall 134, a second side wall 136 and a rear wall 138. The inner wall 132 may rest on the circuit board 102. For example, the inner wall 132 may be a bottom wall (for example, to engage the upper surface of the circuit board 102) or may be a top wall (for example, to engage the lower surface of the circuit board 102). The walls 114 define a cavity 140. For example, the cavity 140 may be defined by the top wall 130, the bottom wall 132, the side walls 134, 136 and the rear wall 138. The walls 114 extend between a front 142 and a rear 144 of the receptacle cage 110. The separator walls 118 separate or divide the cavity 140 into the various module channels 116. In an exemplary embodiment, the communication connectors 200 are received in the cavity 140 proximate to the rear wall 138. The communication connectors 200 are aligned with the corresponding module channels 116.

Figure 2:
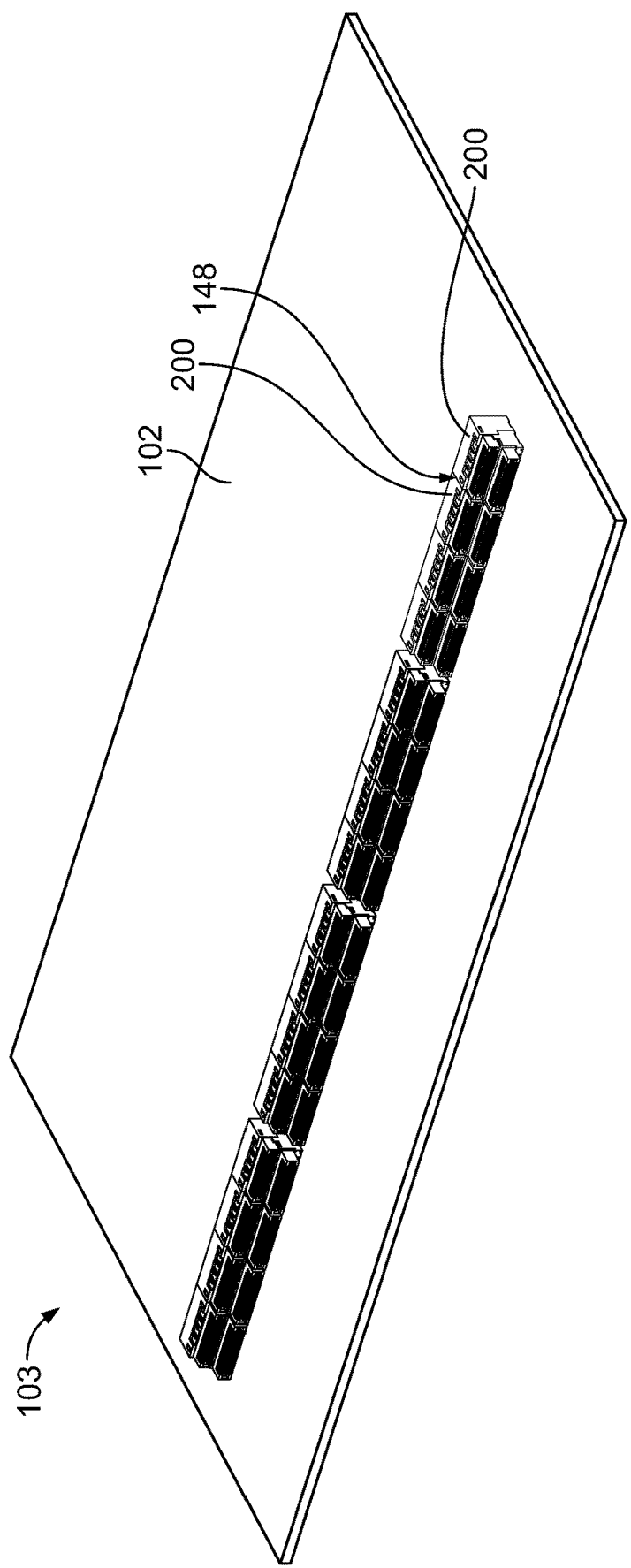
FIG. 2 is a perspective view of a portion of a circuit board assembly of the communication system in accordance with an exemplary embodiment.

FIG. 2 is a perspective view of a portion of the circuit board assembly 103 with the receptacle cage 110 (FIG. 1) removed to illustrate the communication connectors 200 mounted to the circuit board 102. Any number of the communication connectors 200 may be mounted to the circuit board 102. Optionally, the communication connectors 200 may be arranged in groups, such as groups of four communication connectors 200. Each group of communication connectors 200 is received in the corresponding receptacle cage 110.

Each communication connector 200 is coupled to the circuit board 102 at an appropriate mounting location. Optionally, gaps 148 may be provided between the communication connectors 200. The gaps 148 between the communication connectors 200 within a group may be the same (for example, at a common pitch). The gap 148 may accommodate the separator walls 118 (shown in FIG. 1). The gaps 148 between communication connectors 200 of different groups may be different, such as to accommodate the side walls of both receptacle cages 110. The communication connector 200 may be surface mounted to the circuit board 102 in various embodiments. The communication connector 200 may be press-fit to the circuit board 102 in various embodiments. The communication connector 200 may be through hole soldered to the circuit board 102 in various embodiments.

Figure 3:
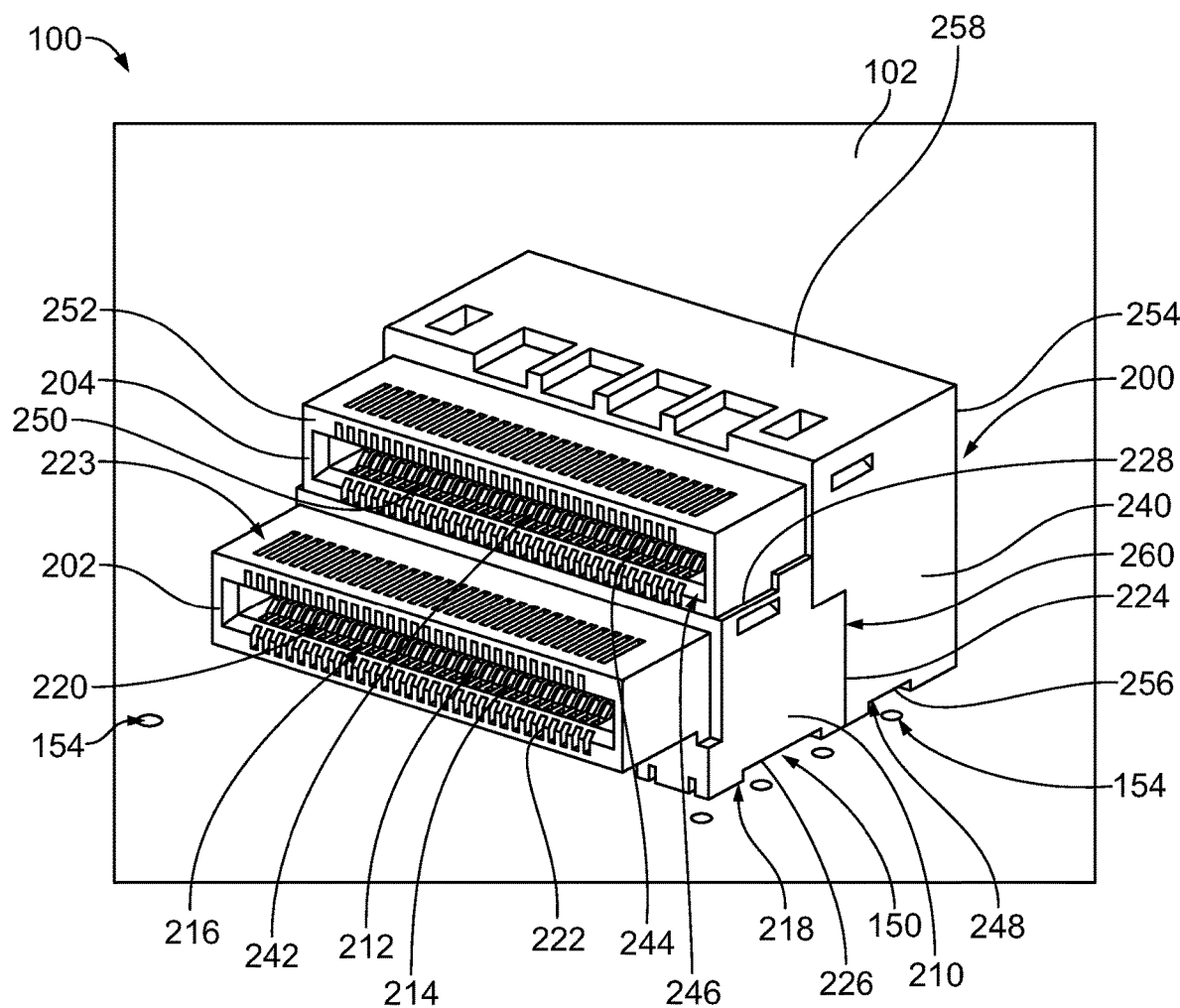
FIG. 3 is a perspective view of a portion of the communication system showing a communication connector in accordance with an exemplary embodiment.

FIG. 3 is a perspective view of a portion of the communication system 100 showing one of the communication connectors 200 mounted to the circuit board 102 in accordance with an exemplary embodiment. The circuit board 102 includes a mounting area 150. The communication connector 200 is mounted to the mounting area 150 of the circuit board 102. The circuit board 102 includes vias 154 configured to receive mounting pins, such as press-fit pins, of the receptacle cage 110 (FIG. 1) to align and secure the receptacle cage 110 to the circuit board 102. The circuit board 102 includes conductors, such as signal conductors and ground conductors, configured to be electrically connected to contacts of the communication connector 200. In various embodiments, the conductors may be contact pads or other circuit traces of the circuit board 102. The contacts of the communication connector 200 may be soldered to the contact pads. In other various embodiments, the conductors may be plated vias and the contact of the communication connector 200 may be press-fit into the plated vias.

The communication connector 200 includes an inner receptacle connector 202 and an outer receptacle connector 204. The inner receptacle connector 202 is located between the outer receptacle connector 204 and the circuit board 102. The inner receptacle connector 202 defines a first mating interface and first signal paths between the circuit board 102 and the pluggable module 300. The outer receptacle connector 204 defines a second mating interface and second signal paths between the circuit board 102 and the pluggable module 300.

The inner receptacle connector 202 has an inner housing 210 holding an inner contact array 212 of inner contacts 214. The inner housing 210 is manufactured from a dielectric material, such as a plastic material. The inner receptacle connector 202 has an inner mating interface 216 and an inner mounting interface 218 configured to be mounted to the circuit board 102. The inner mounting interface 218 is perpendicular to the inner mating interface 216 in the illustrated embodiment. For example, the inner receptacle connector 202 is a right-angle connector. The inner receptacle connector 202 may be a straight pass-through connector in an alternative embodiment rather than a right-angle connector. The inner contacts 214 extend between the inner mating interface 216 and the inner mounting interface 218. The inner contacts 214 in the inner contact array 212 include a plurality of signal contacts and a plurality of ground contacts. The inner contacts 214 include spring beams defining separable interfaces at the inner mating interface 216. The inner contacts 214 may include solder tails or press-fit pins at the inner mounting interface 218 for termination to the circuit board 102.

The inner mating interface 216 includes a first slot 220, which may be a card slot configured to receive a card edge of a circuit card or a plug slot configured to receive a plug end of a plug connector. The inner contacts 214 are arranged in the first slot 220 to interface with the pluggable module 300. The inner contacts 214 may be arranged along a top and a bottom of the first slot 220 for interfacing with upper and lower contacts of the plug that is plugged into the first slot 220. The inner contact array 212 is a lower contact array in the illustrated embodiment located below the outer receptacle connector 204.

The inner housing 210 has a front 222 and a rear 224. The inner mating interface 216 is provided at the front 222. The outer receptacle connector 204 extends along the rear 224 and is thus rearward of the inner receptacle connector 202. The inner housing 210 has an inner end 226 and an outer end 228. The inner mounting interface 218 is provided at the inner end 226. The inner end 226 is mounted to the circuit board 102. In the illustrated embodiment, the inner end 226 is a bottom of the inner housing 210. However, for communication connectors 200 mounted to the lower surface of the circuit board 102, the inner end 226 is a top of the inner housing 210. The outer receptacle connector 204 extends along the outer end 228.

The outer receptacle connector 204 has an outer housing 240 holding an outer contact array 242 of outer contacts 244. The outer housing 240 is manufactured from a dielectric material, such as a plastic material. The outer receptacle connector 204 has an outer mating interface 246 and an outer mounting interface 248 configured to be mounted to the circuit board 102. The outer mounting interface 248 is perpendicular to the outer mating interface 246 in the illustrated embodiment. For example, the outer receptacle connector 204 is a right-angle connector. The outer receptacle connector 204 may be a straight pass-through connector in an alternative embodiment rather than a right-angle connector. The outer contacts 244 extend between the outer mating interface 246 and the outer mounting interface 248. The outer contacts 244 in the outer contact array 242 include a plurality of signal contacts and a plurality of ground contacts. The outer contacts 244 include spring beams defining separable interfaces at the outer mating interface 246. The outer contacts 244 may include solder tails or press-fit pins at the outer mounting interface 248 for termination to the circuit board 102.

The outer mating interface 246 includes a second slot 250, which may be a card slot configured to receive a card edge of a circuit card or a plug slot configured to receive a plug end of a plug connector. The outer contacts 244 are arranged in the second slot 250 to interface with the pluggable module 300. The outer contacts 244 may be arranged along a top and a bottom of the second slot 250 for interfacing with upper and lower contacts of the plug that is plugged into the second slot 250. The outer contact array 242 is an upper contact array in the illustrated embodiment located above the outer receptacle connector 204.

The outer housing 240 has a front 252 and a rear 254. The outer mating interface 246 is provided at the front 252. The outer receptacle connector 204 extends along the rear 224 of the inner receptacle connector 202 and is thus rearward of the inner receptacle connector 202. The outer housing 240 has an inner end 256 and an outer end 258. The inner end 256 is mounted to the circuit board 102. In the illustrated embodiment, the outer end 258 is a top of the outer housing 240. However, for communication connectors 200 mounted to the lower surface of the circuit board 102, the outer end 258 is a bottom of the outer housing 240. The inner end 256 of the outer housing 240 includes a pocket 260 that receives the inner housing 210. The outer housing 240 thus surrounds a portion of the inner housing 210.

In an exemplary embodiment, the outer mating interface 246 is recessed relative to the inner mating interface 216. For example, the front 252 of the outer housing 240 is located rearward of the front 222 of the inner housing 210. As such, the first slot 220 is located forward of the second slot 250. The inner housing 210 includes an extension 223 extending to the front 222 of the inner housing 210. The extension 223 extends forward of the outer housing 240.

In the illustrated embodiment, the inner housing 210 is separate and discrete from the outer housing 240. The outer housing 240 may be coupled to the inner housing 210. For example, the inner housing 210 may support the outer housing 240. In alternative embodiments, the inner housing 210 and the outer housing 240 may be integral as a unitary housing holding both the inner contact array 212 and the outer contact array 242. For example, the inner housing 210 and the outer housing 240 may be co-molded during a single molding process rather than being separately molded pieces.

Figure 4:
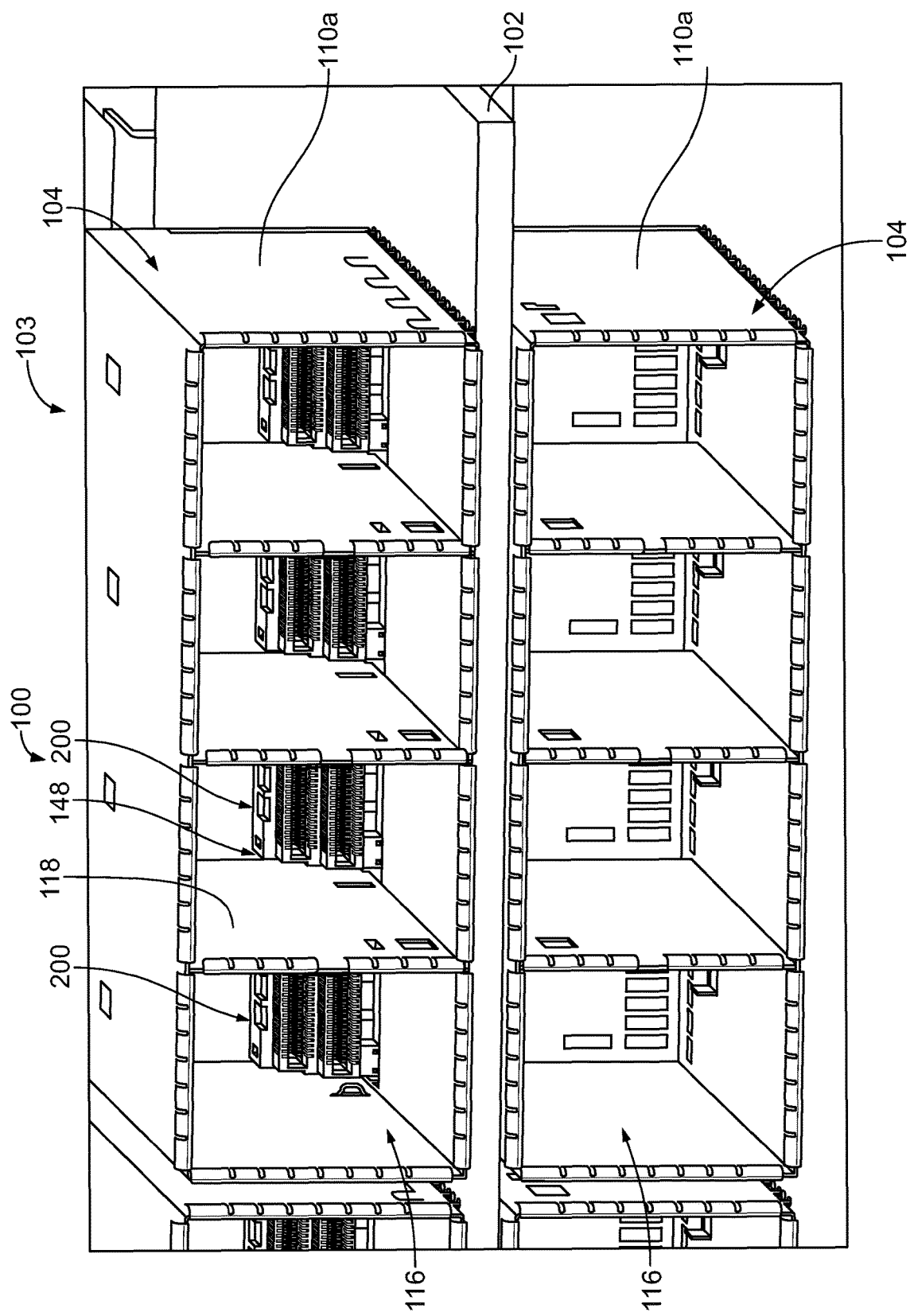
FIG. 4 illustrates a portion of the communication system showing a portion of one of the circuit board assemblies in accordance with an exemplary embodiment.

FIG. 4 illustrates a portion of the communication system 100 showing a portion of one of the circuit board assemblies 103. FIG. 4 illustrates receptacle connector assemblies 104 mounted to both the upper surface and the lower surface of the circuit board 102. In the illustrated embodiment, the quad-receptacle cage 110a is provided. The receptacle cage 110a includes three separating walls 118 to form four module channels 116. The module channels 116 are aligned with the four communication connectors 200. The separating walls 118 extend into the gaps 148 between the communication connectors 200. The module channels 116 are sized and shaped to receive the pluggable modules 300a (FIG. 7).

Figure 5:
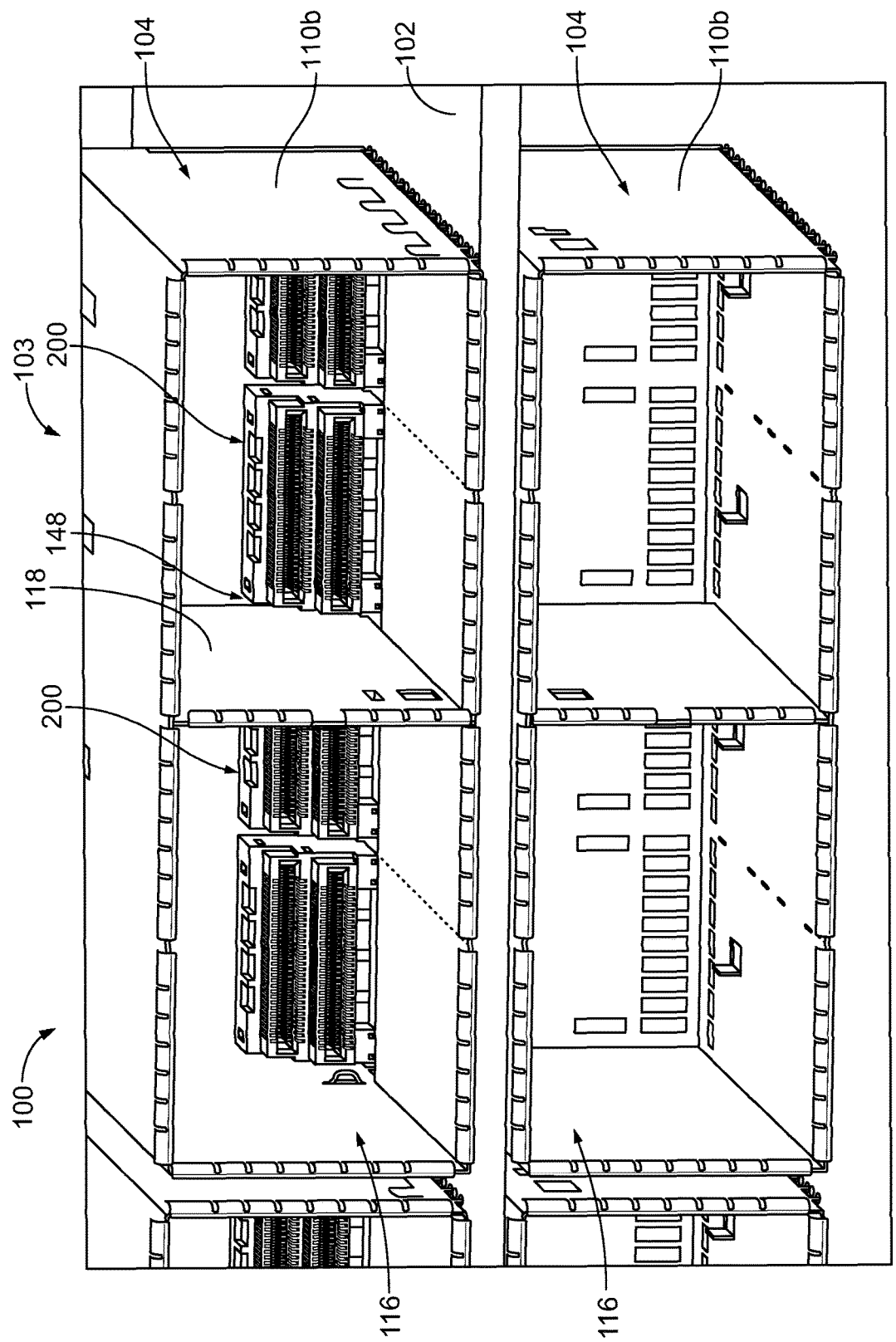
FIG. 5 illustrates a portion of the communication system showing a portion of one of the circuit board assemblies in accordance with an exemplary embodiment.
Figure 8:
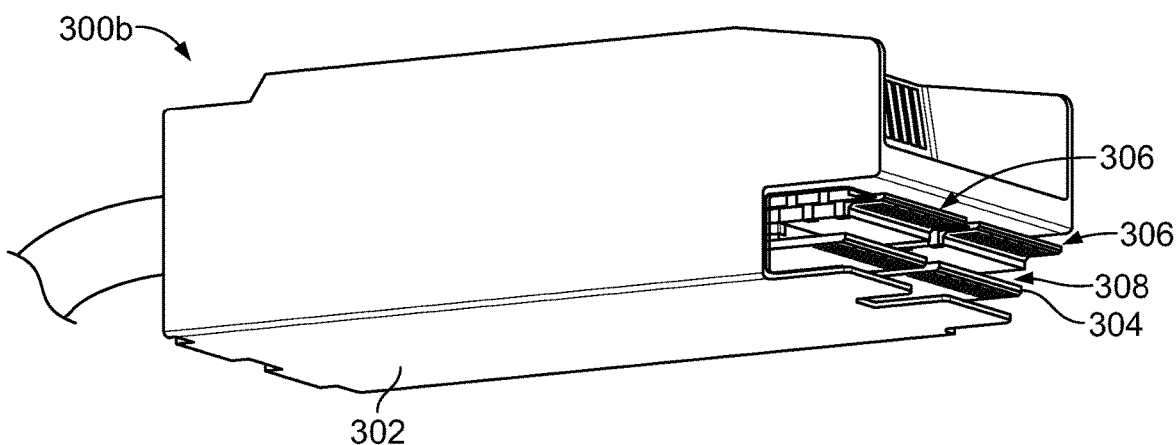
FIG. 8 is a perspective view of the pluggable module of the communication system in accordance with an exemplary embodiment.

FIG. 5 illustrates a portion of the communication system 100 showing a portion of one of the circuit board assemblies 103. FIG. 5 illustrates receptacle connector assemblies 104 mounted to both the upper surface and the lower surface of the circuit board 102. In the illustrated embodiment, the dual-receptacle cage 110b is provided. The receptacle cage 110b includes one separating wall 118 to form two module channels 116. The module channels 116 are aligned with the four communication connectors 200 (two communication connectors 200 in each module channel 116). The positioning of the four communication connectors 200 may be the same as the positioning shown in FIG. 4. The separating wall 118 extend into the gap 148 between the middle two communication connectors 200. The module channels 116 are sized and shaped to receive the pluggable modules 300b (FIG. 8).

Figure 6:
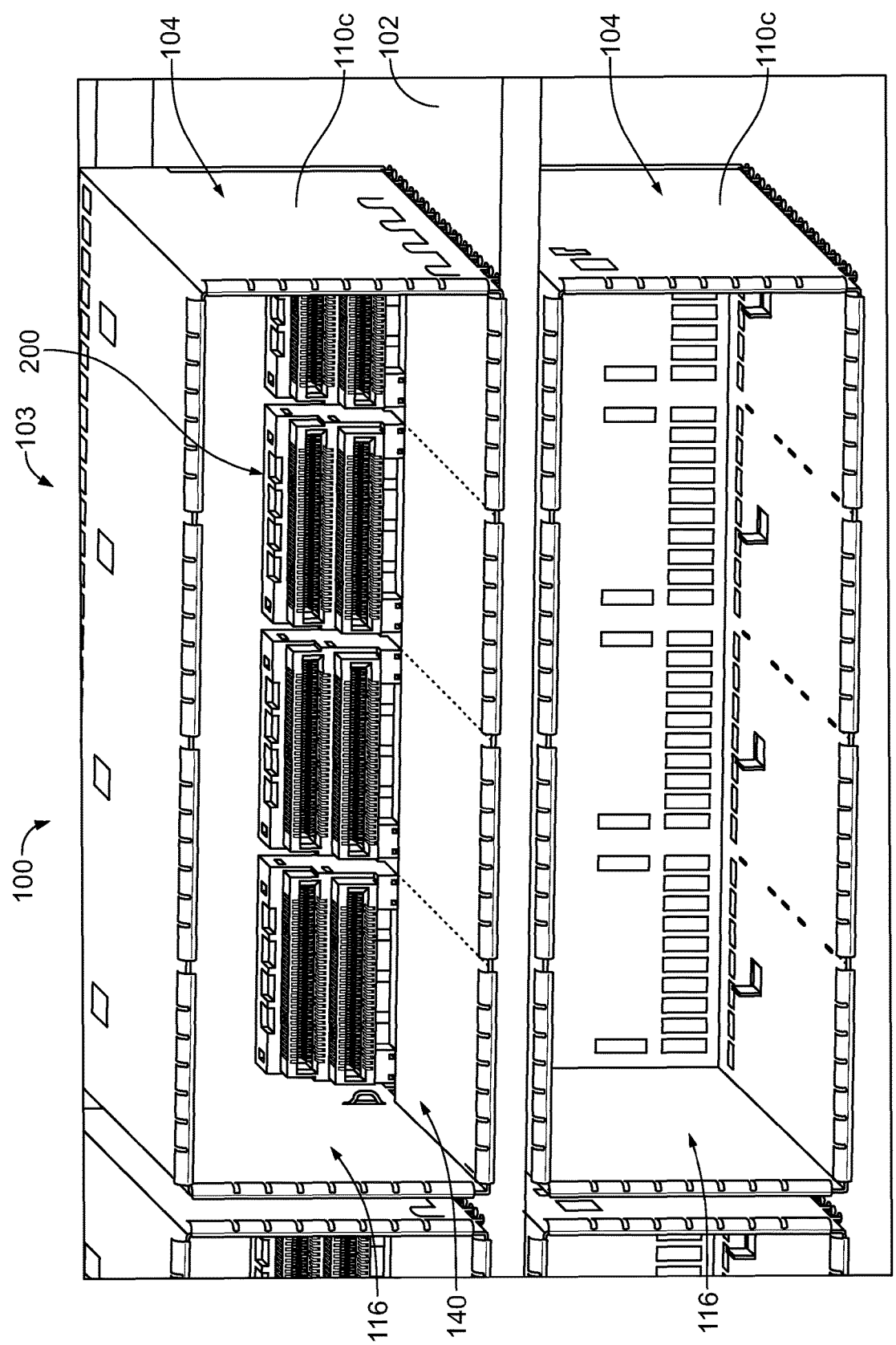
FIG. 6 illustrates a portion of the communication system showing a portion of one of the circuit board assemblies in accordance with an exemplary embodiment.
Figure 9:
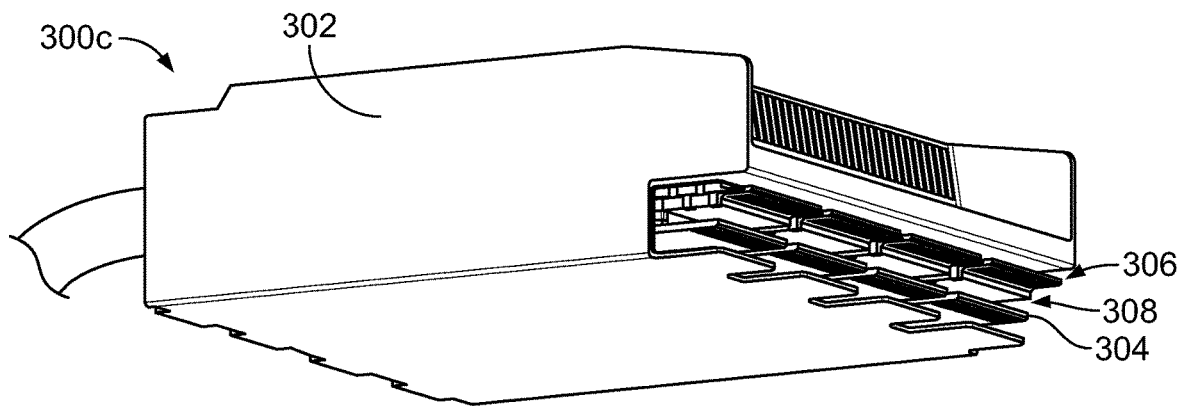
FIG. 9 is a perspective view of the pluggable module of the communication system in accordance with an exemplary embodiment.

FIG. 6 illustrates a portion of the communication system 100 showing a portion of one of the circuit board assemblies 103. FIG. 6 illustrates receptacle connector assemblies 104 mounted to both the upper surface and the lower surface of the circuit board 102. In the illustrated embodiment, the single-receptacle cage 110c is provided. The receptacle cage 110c does not include any separating walls 118. Rather, the cavity 140 forms a single module channel 116. The module channel 116 is aligned with the four communication connectors 200. The positioning of the four communication connectors 200 may be the same as the positioning shown in FIGS. 4 and 5. The module channel 116 is sized and shaped to receive the pluggable module 300c (FIG. 9).

Figure 7:
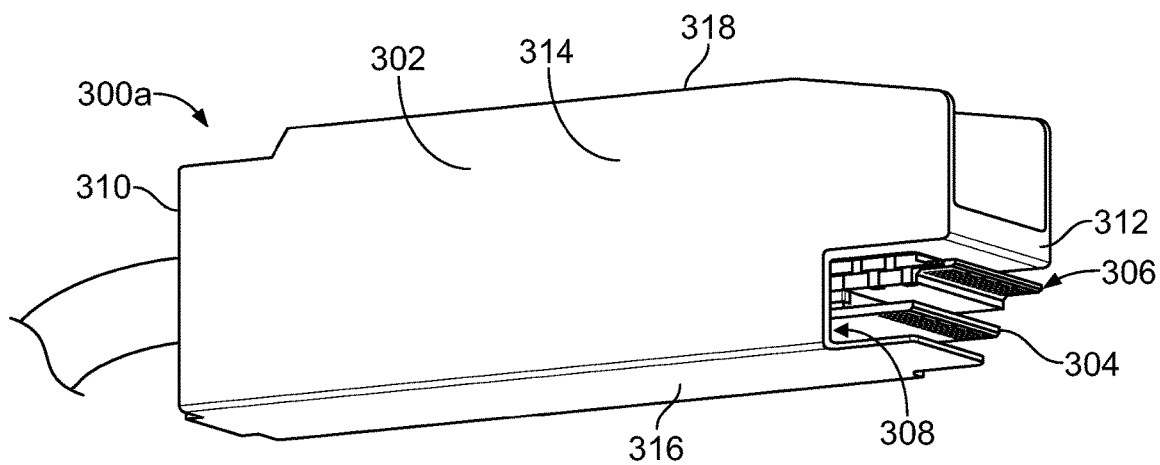
FIG. 7 is a perspective view of a pluggable module of the communication system in accordance with an exemplary embodiment.

FIG. 7 is a perspective view of the pluggable module 300a in accordance with an exemplary embodiment. In the illustrated embodiment, the single-wide pluggable module 300a is illustrated. The pluggable module 300a includes a pluggable body 302 that holds a module circuit board 304 and a plug connector 306 in a module cavity 308 of the pluggable body 302. The plug connector 306 extends from the module circuit board 304. The pluggable body 302 is configured to be plugged into the module channel 116 of the receptacle cage 110a (FIG. 4) for mating with the communication connector 200 (FIG. 3). The module circuit board 304 is mated with the inner receptacle connector 202 (FIG. 3) and the plug connector 306 is mated with the outer receptacle connector 204 (FIG. 3). In an alternative embodiment, the module circuit board 304 is configured to be mated with the outer receptacle connector 204 and the plug connector 306 is configured to be mated with the inner receptacle connector 202. For example, the pluggable module 300a may be inverted or flipped 180° when mating with the communication connector 200 or the module circuit board 304 may be inverted or flipped 180° in the pluggable body 302 such that the plug connector 306 is located at the bottom. In other alternative embodiments, two plug connectors 306 may be provided configured to mate with the inner and outer receptacle connectors 202, 204 or two module circuit boards 304 may be provided configured to mate with the inner and outer receptacle connectors 202, 204. In the illustrated embodiment, the module circuit board 304 has a single mating interface for mating with a single communication connector 200. In the illustrated embodiment, the pluggable module 300a includes a single plug connector 306 for mating with a single communication connector 200.

The pluggable body 302 extends between a cable end 310 at a front of the pluggable module 300a and a mating end 312 at a rear of the pluggable module 300a. The pluggable body 302 includes sides 314 extending between an inner end 316 and an outer end 318. The inner end 316 may be a bottom and the outer end 318 may be a top. However, the pluggable module 300a may be mated in an inverted orientation, such as to a receptacle cage 110 on a lower surface of the circuit board 102. The sides 314 and the ends 316, 318 define the module cavity 308. The pluggable body 302 may include openings to allow airflow through the pluggable module 300a for cooling the components of the pluggable module 300a. The module circuit board 304 and the plug connector 306 are positioned in the module cavity 308 for mating with the communication connector 200. For example, the pluggable body 302 may be open at the mating end 312 to expose mating ends of the module circuit board 304 and the plug connector 306.

FIG. 8 is a perspective view of the pluggable module 300b in accordance with an exemplary embodiment. In the illustrated embodiment, the double-wide pluggable module 300b is illustrated. The pluggable module 300b includes the pluggable body 302 that holds the module circuit board 304 and a pair of the plug connectors 306 in the module cavity 308. In the illustrated embodiment, a single module circuit board 304 is provided and both plug connectors 306 are mounted to the module circuit board 304. Alternatively, a pair of the module circuit boards 304 may be provided, each having a corresponding plug connector 306 extending therefrom. The pluggable body 302 is configured to be plugged into the module channel 116 of the receptacle cage 110b (FIG. 5) for mating with two of the communication connectors 200 (FIG. 5). Edges of the module circuit board 304 are mated with the inner receptacle connectors 202 (FIG. 3) and the plug connectors 306 are mated with the outer receptacle connectors 204 (FIG. 3). In the illustrated embodiment, the module circuit board 304 has a pair of mating interfaces (for example, two card edges) for mating with a pair of the communication connectors 200. In the illustrated embodiment, the pair of plug connectors 306 are mated with the pair of communication connectors 200.

FIG. 9 is a perspective view of the pluggable module 300c in accordance with an exemplary embodiment. In the illustrated embodiment, the quad-wide pluggable module 300c is illustrated. The pluggable module 300c includes the pluggable body 302 that holds the module circuit board 304 and four of the plug connectors 306 in the module cavity 308. In the illustrated embodiment, a single module circuit board 304 is provided and all four plug connectors 306 are mounted to the module circuit board 304. Alternatively, a pair of the module circuit boards 304 may be provided or four separate module circuit boards 304 may be provided, with the plug connector 306 mounted to the corresponding module circuit boards 304. The pluggable body 302 is configured to be plugged into the module channel 116 of the receptacle cage 110c (FIG. 6) for mating with four of the communication connectors 200 (FIG. 6). Edges of the module circuit board 304 are mated with the inner receptacle connectors 202 (FIG. 3) and the plug connectors 306 are mated with the outer receptacle connectors 204 (FIG. 3). In the illustrated embodiment, the module circuit board 304 has four mating interfaces (for example, four card edges) for mating with the four communication connectors 200. In the illustrated embodiment, the four plug connectors 306 are mated with the four communication connectors 200.

Figure 10:
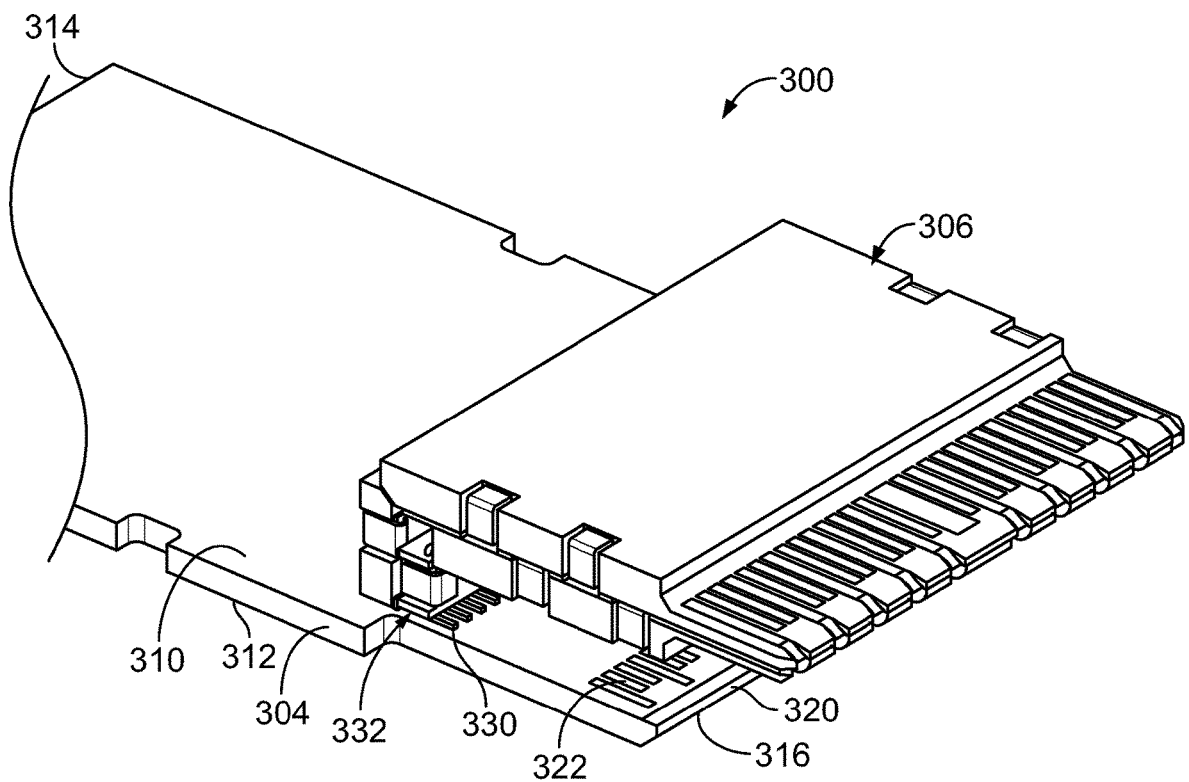
FIG. 10 is a rear perspective view of a portion of the pluggable module in accordance with an exemplary embodiment.
Figure 11:
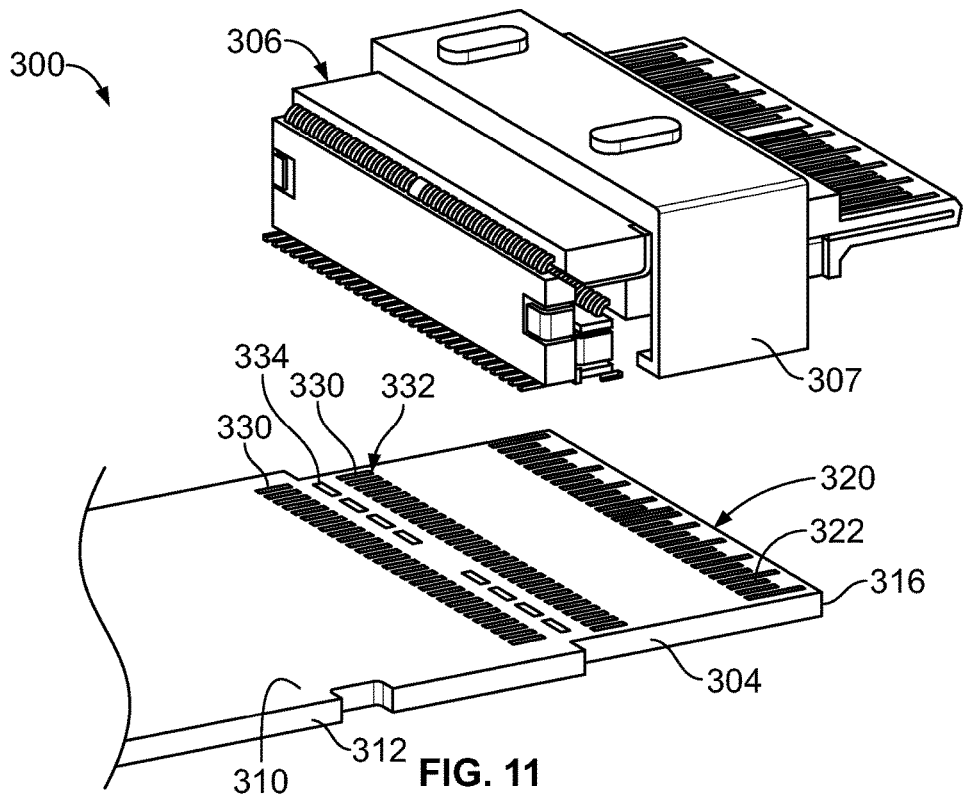
FIG. 11 is an exploded, front perspective view of a portion of the pluggable module in accordance with an exemplary embodiment.

FIG. 10 is a rear perspective view of a portion of the pluggable module 300 in accordance with an exemplary embodiment. FIG. 11 is an exploded, front perspective view of a portion of the pluggable module 300 in accordance with an exemplary embodiment. FIG. 11 illustrates a mounting support 307 used for mounting the plug connector 306 to the module circuit board 304. The mounting support 307 is removable after soldering the plug connector 306 to the module circuit board 304. The pluggable body 302 (shown in FIG. 7) is removed to illustrate the module circuit board 304 and the plug connector 306. The plug connector 306 extends from the module circuit board 304 to form a dual mating interface for the pluggable module 300 to increase the density of the signal paths through the pluggable module 300 and thus increase the data throughput for the pluggable module 300.

The module circuit board 304 includes a first surface 310 and a second surface 312 extending between a cable end 314 and a mating end 316 rearward of the cable end 314. The module circuit board 304 has a mating edge 320 at the mating end 316 configured to be plugged into the first slot 220 of the communication connector 200 (FIG. 3). The module circuit board 304 has mating pads 322 at the mating edge 320. In an exemplary embodiment, the mating pads 322 are provided on the first surface 310 and the second surface 312. The mating pads 322 are configured to be mated with inner contacts 214 of the communication connector 200 when the mating edge 320 is plugged into the first slot 220 of the communication connector 200.

The module circuit board 304 includes connector pads 330 at a mounting location 332 on the first surface 310. The connector pads 330 are located remote from the mating edge 320, such as forward of the mating edge 320. In the illustrated embodiment, the connector pads 330 are arranged in multiple rows, such as a forward row and a rearward row. The module circuit board 304 may include a row of ground pads 334 between the forward row and the rearward row. The plug connector 306 is terminated to the module circuit board 304 at the mounting location 332. For example, the plug connector 306 may be soldered to the connector pads 330.

Figure 12:
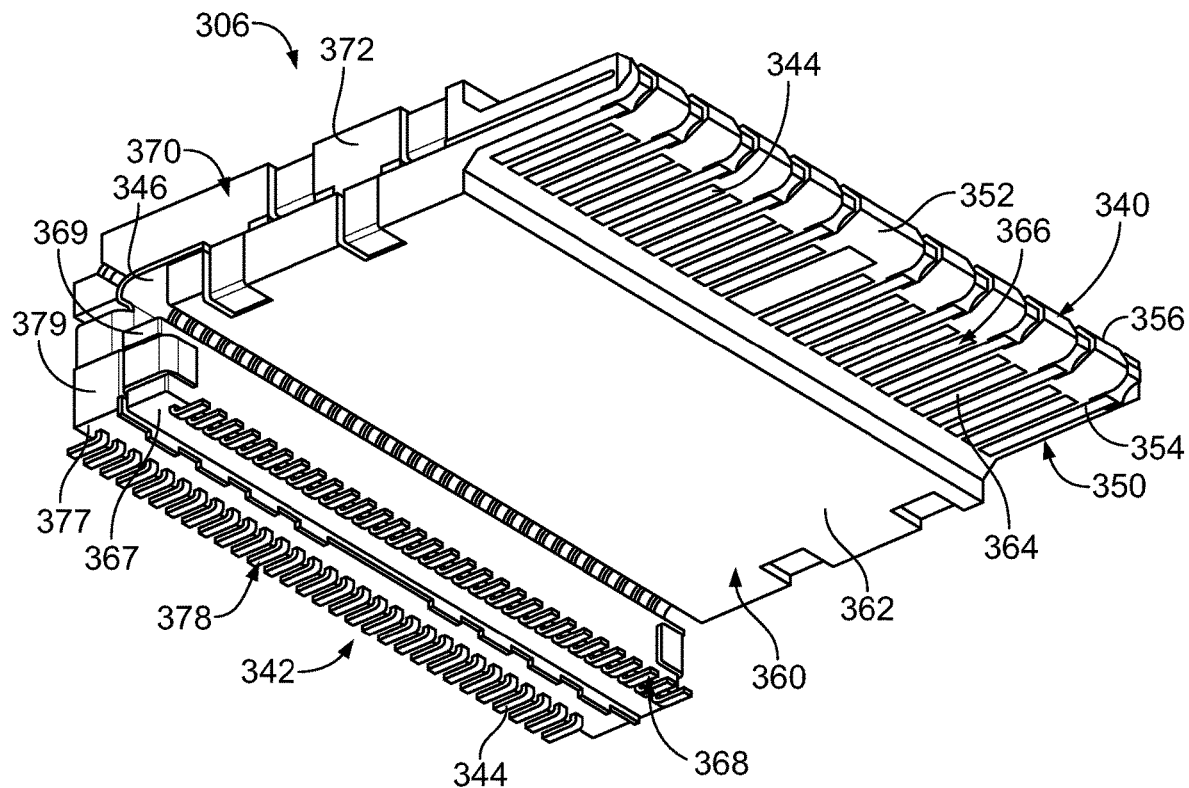
FIG. 12 is a bottom perspective view of the plug connector in accordance with an exemplary embodiment.
Figure 13:
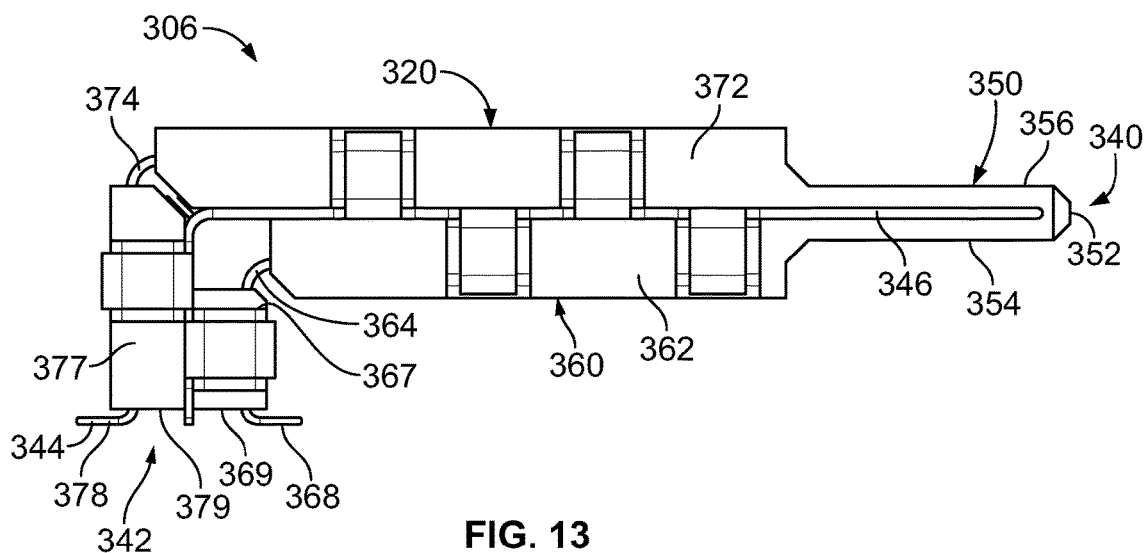
FIG. 13 is a side view of the plug connector in accordance with an exemplary embodiment.
Figure 14:
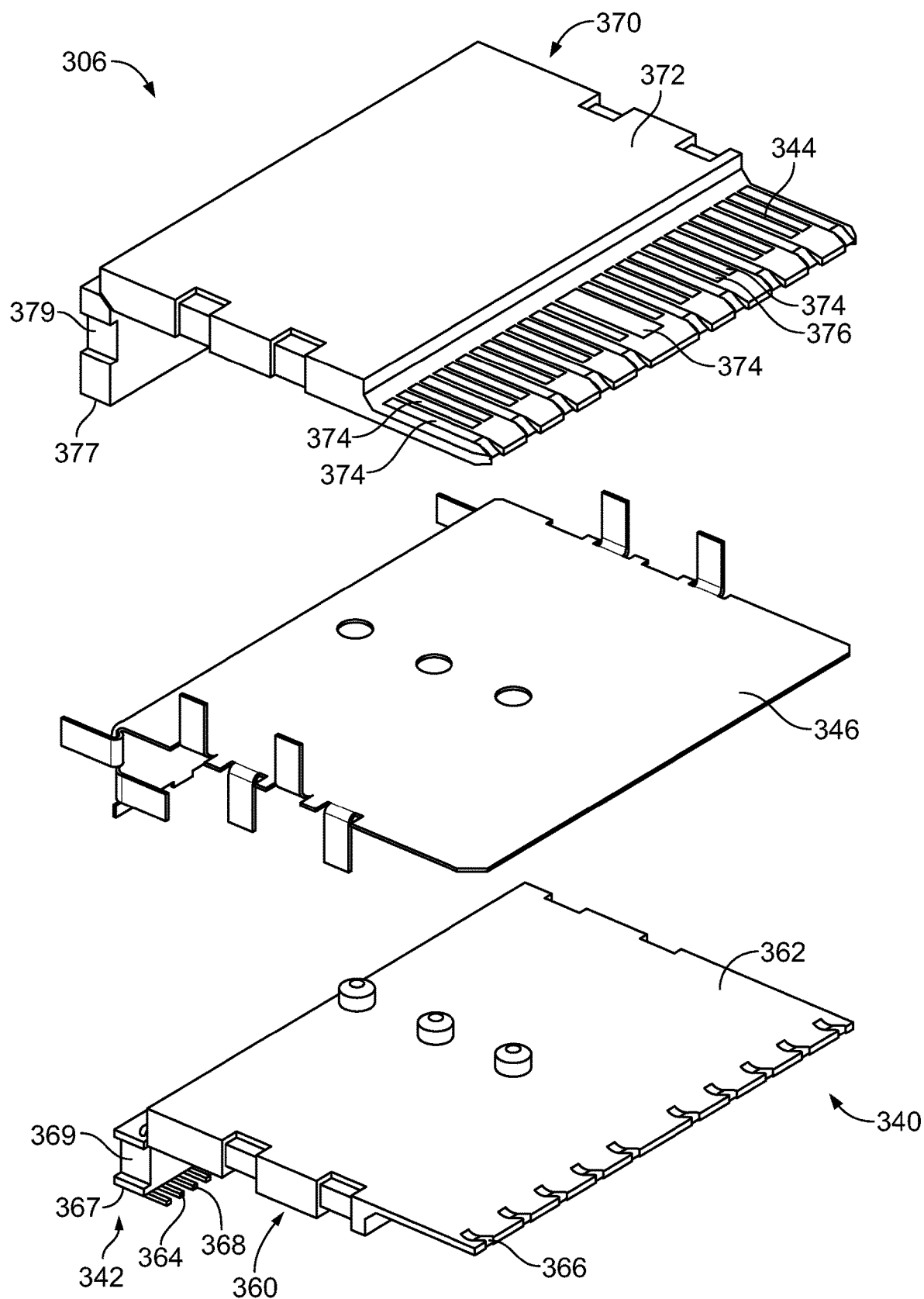
FIG. 14 is an exploded, top perspective view of the plug connector in accordance with an exemplary embodiment.
Figure 15:
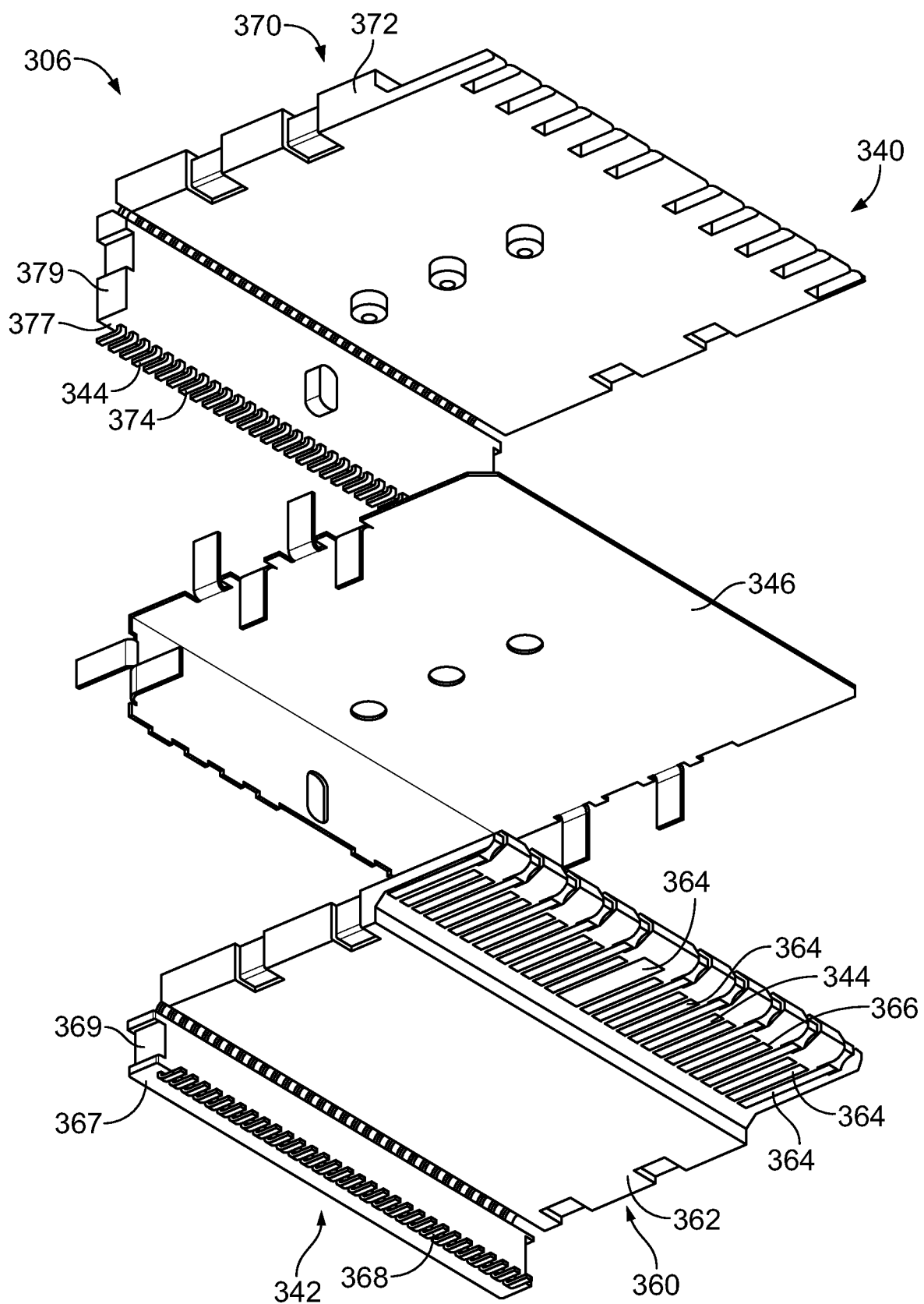
FIG. 15 is an exploded, bottom perspective view of the plug connector in accordance with an exemplary embodiment.

FIG. 12 is a bottom perspective view of the plug connector 306 in accordance with an exemplary embodiment. FIG. 13 is a side view of the plug connector 306 in accordance with an exemplary embodiment. FIG. 14 is an exploded, top perspective view of the plug connector 306 in accordance with an exemplary embodiment. FIG. 15 is an exploded, bottom perspective view of the plug connector 306 in accordance with an exemplary embodiment.

The plug connector 306 extends between a plug mating end 340 and a plug mounting end 342. The plug mounting end 342 is configured to be mounted to the module circuit board 304 at the mounting location 332 (shown in FIG. 11). The plug connector 306 includes plug contacts 344 extending between the plug mating end 340 and the plug mounting end 342. The plug mating end 340 is configured to be plugged into the second slot 250 (FIG. 3) of the communication connector 200 (FIG. 3) to mate the plug contacts 344 with the outer contacts 244 (FIG. 3) of the communication connector 200. In an exemplary embodiment, the plug connector 306 includes a ground plate 346 providing electrical shielding for the plug contacts 344. The ground plate 346 may be terminated to the ground pads 334 (FIG. 11).

In an exemplary embodiment, the plug connector 306 includes a platform 350 extending to a platform edge 352 at the plug mating end 340. The platform 350 supports the plug contacts 344. In an exemplary embodiment, the plug contacts 344 are provided on an inner surface 354 and an outer surface 356 of the platform 350 (for example, the top surface and the bottom surface of the platform 350). The platform 350 is configured to be oriented parallel to and spaced apart from the module circuit board 200. The inner surface 354 faces the module circuit board 200. The plug contacts 344 extend along the platform 350 to the platform edge 352. The platform edge 352 is configured to be plugged into the second slot 250 of the communication connector 200.

In an exemplary embodiment, the plug connector 306 includes an inner contact assembly 360 and an outer contact assembly 370. The inner and outer contact assemblies 360, 370 are coupled together to form the plug connector 306. In an exemplary embodiment, the ground plate 346 is located between the inner contact assembly 360 and the outer contact assembly 370. The plug connector 306 may be oriented in an upright orientation such that the inner contact assembly 360 is a lower contact assembly and the outer contact assembly 370 is an upper contact assembly. However, the plug connector 306 may be oriented in an upside-down orientation such that the inner contact assembly 360 is an upper contact assembly and the outer contact assembly 370 is a lower contact assembly.

The inner contact assembly 360 includes a dielectric inner frame 362 holding inner plug contacts 364. The inner plug contacts 364 define a subset or group of the plug contacts 344. In an exemplary embodiment, the inner plug contacts 364 are a leadframe. For example, the inner plug contacts 364 may be stamped and formed contacts. In an exemplary embodiment, the inner frame 362 is overmolded over the inner plug contacts 364. Alternatively, the inner plug contacts 364 may be loaded into a pre-molded inner frame 362. The inner plug contacts 364 may include signal contacts and/or ground contacts and/or power contacts. In various embodiments, the signal contacts 364 may be arranged in pairs between the ground contacts. Each inner plug contact 364 extends between a mating end 366 and a terminating end 368. The mating end 366 is provided near the rear edge of the inner frame 362 (for example, the platform edge 352). The terminating end 368 is provided at an inner edge 367 of a platform support 369 for termination to the module circuit board 200.

The outer contact assembly 370 includes a dielectric outer frame 372 holding outer plug contacts 374. The outer plug contacts 374 define a subset or group of the plug contacts 344. In an exemplary embodiment, the outer plug contacts 374 are a leadframe. For example, the outer plug contacts 374 may be stamped and formed contacts. In an exemplary embodiment, the outer frame 372 is overmolded over the outer plug contacts 374. Alternatively, the outer plug contacts 374 may be loaded into a pre-molded outer frame 372. The outer plug contacts 374 may include signal contacts and/or ground contacts and/or power contacts. In various embodiments, the signal contacts 374 may be arranged in between the ground contacts. Each outer plug contact 374 extends between a mating end 376 and a terminating end 378. The mating end 376 is provided near the rear edge of the outer frame 372 (for example, the platform edge 352). The terminating end 378 is provided at an outer edge 377 of a platform support 379 for termination to the module circuit board 200.

In an exemplary embodiment, the platform supports 369, 379 are oriented generally perpendicular to the platform 350. The plug contacts 344 are bent at right angles at the transition. In an exemplary embodiment, the platform supports 369, 379 are separate from the platform 350, such as being separately molded around the plug contacts 344, to allow the plug contacts 344 to be bent to the right angle. Optionally, the area between the platform supports 369, 379 and the platform 350 may be filled with dielectric material, such as plastic material, after the plug contacts 344 are formed into the right angle. The filler material may provide impedance control along the signals transmission lines.

Figure 16:
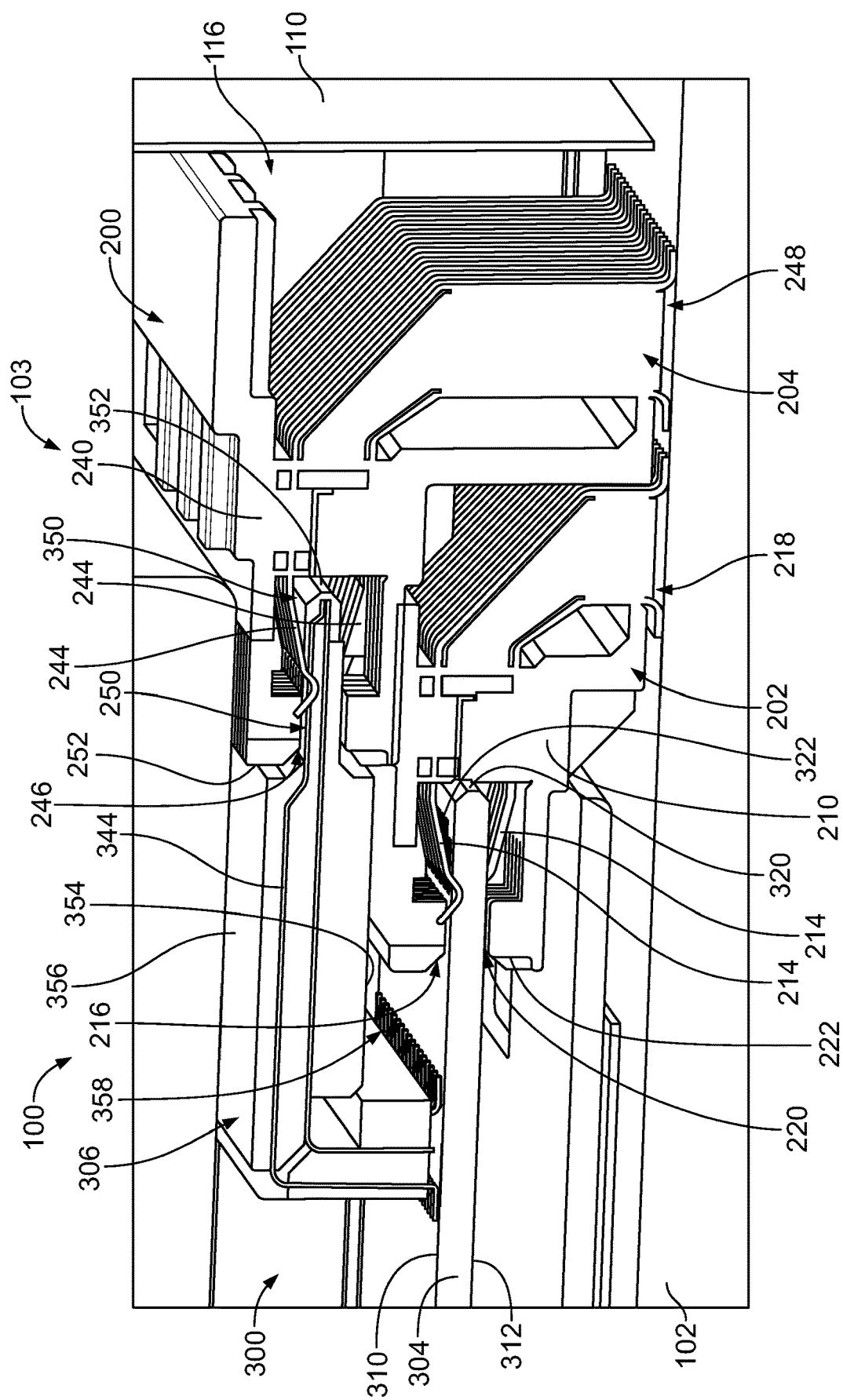
FIG. 16 is a cross sectional view of the communication system in accordance with an exemplary embodiment.

FIG. 16 is a cross sectional view of the communication system 100 in accordance with an exemplary embodiment. The pluggable module 300 is coupled to the circuit board assembly 103. For example, the pluggable module 300 is loaded into the module channel 116 in the receptacle cage 110 to mate with the communication connector 200.

The communication connector 200 includes the inner receptacle connector 202 and the outer receptacle connector 204. The inner receptacle connector 202 defines the inner mating interface 216 and the first signal paths for electrical connection with the module circuit board 304. The outer receptacle connector 204 defines the outer mating interface 246 and the second signal paths for electrical connection with the plug connector 306. The inner receptacle connector 202 is a right-angle connector. The inner contacts 214 are right-angle contacts extending between the inner mating interface 216 and the inner mounting interface 218. The inner contacts 214 include spring beams defining separable interfaces at the inner mating interface 216 and solder tails at the inner mounting interface 218 for termination to the circuit board 102. In an exemplary embodiment, the inner contacts 214 are arranged in two sets of inner contacts, such as an upper set and a lower set of inner contacts for interfacing with the mating pads 322 at the first surface 310 (upper surface) and the second surface 312 (lower surface). The outer receptacle connector 204 is a right-angle connector. The outer contacts 244 are right-angle contacts extending between the outer mating interface 246 and the outer mounting interface 248. The outer contacts 244 include spring beams defining separable interfaces at the outer mating interface 246 and solder tails at the outer mounting interface 248 for termination to the circuit board 102. In an exemplary embodiment, the outer contacts 244 are arranged in two sets of outer contacts, such as an upper set and a lower set of outer contacts for interfacing with the plug contacts 344 on the inner surface 354 and the outer surface 356 of the platform 350.

In an exemplary embodiment, the outer mating interface 246 is recessed relative to the inner mating interface 216. For example, the front 222 of the inner housing 210 is located forward of the front 252 of the outer housing 240. As such, the first slot 220 is located forward of the second slot 250. The plug connector 306 is mounted to the module circuit board 304 and defines a second plug interface. The platform 350 of the plug connector 306 is spaced apart from the module circuit board 304 and extends generally parallel to the module circuit board 304 (for example, both extend horizontally). The plug connector 306 extends rearward of the module circuit board 304. For example, the platform edge 352 is located rearward of the mating edge 320 of the module circuit board 304 for mating with the second slot 250 of the outer housing 240. A space 358 is defined between the platform 350 and the module circuit board 304. A portion of the inner housing 210 is received in the space 358.

Figure 17:
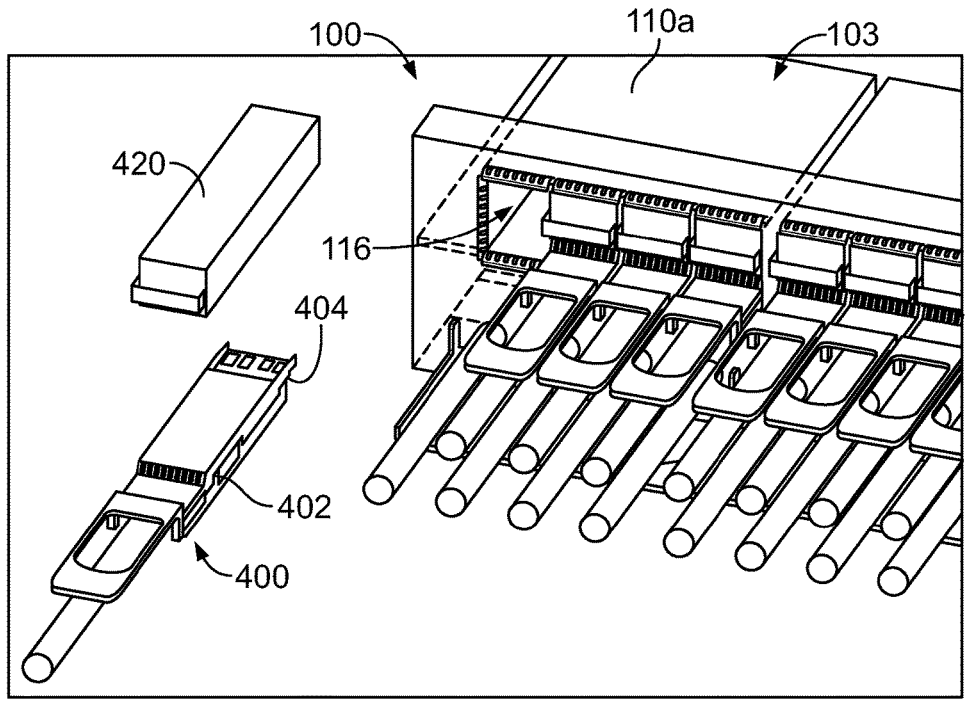
FIG. 17 illustrates a portion of the communication system showing a portion of one of the circuit board assemblies in accordance with an exemplary embodiment.
Figure 18:
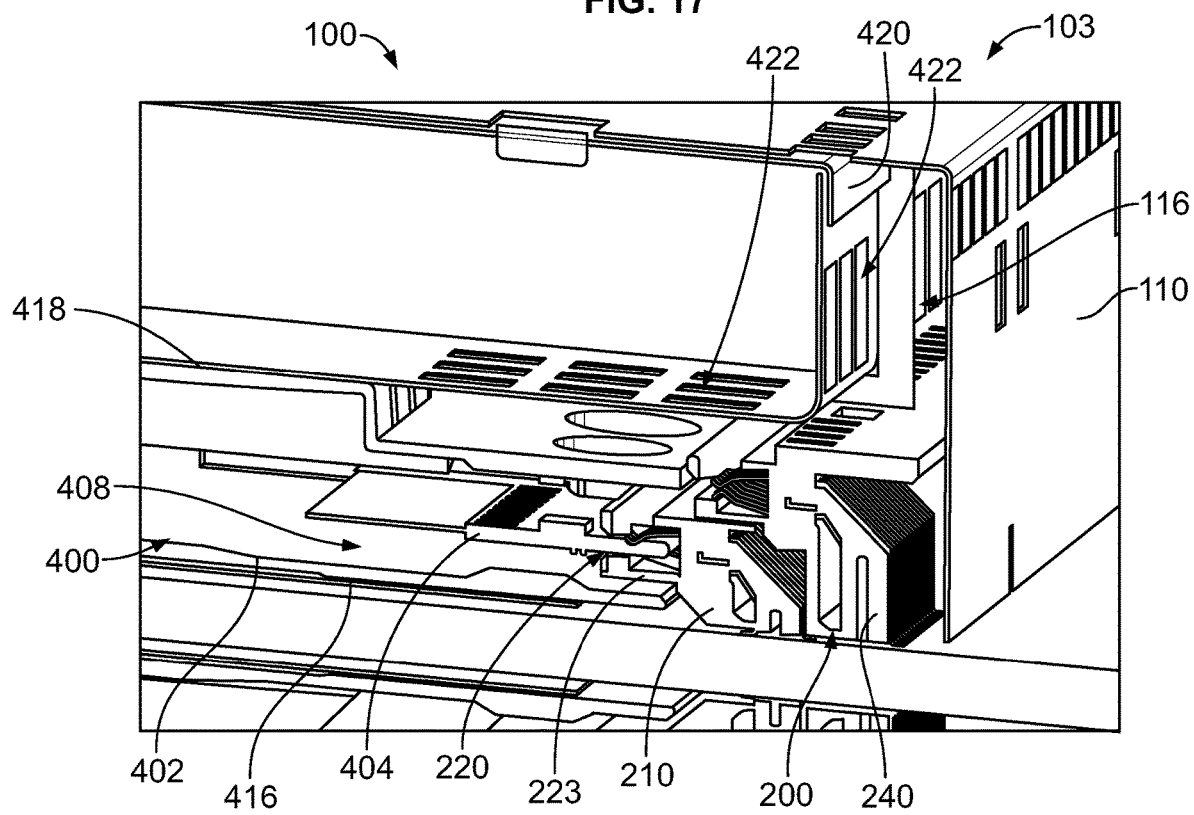
FIG. 18 is a cross sectional view of the communication system in accordance with an exemplary embodiment.

FIG. 17 illustrates a portion of the communication system 100 showing a portion of one of the circuit board assemblies 103. FIG. 18 is a cross sectional view of the communication system 100 in accordance with an exemplary embodiment. In the illustrated embodiment, the quad-receptacle cage 110a is provided. The module channels 116 are sized and shaped to receive conventional pluggable modules 400. The conventional plug module 400 includes a pluggable body 402 that holds a module circuit board 404 in a module cavity 408 of the pluggable body 402. The plug module 400 does not include a plug connector, such as the plug connector 306 (shown in FIG. 16).

In an exemplary embodiment, the communication system 100 includes an insert or filler 420. The filler 420 is received in the module channel 116 to fill the open space of the module channel 116 above (or below) the plug module 400.

The filler 420 is manufactured from a conductive material, such as a metal material, to provide electrical shielding, such as EMI shielding. For example, the filler 420 may be a stamped and formed structure. The filler 420 may be secured to the plug module 400 and/or the receptacle cage 110. In an exemplary embodiment, the filler 420 includes airflow openings 422 that allow airflow through the filler 420. The airflow may allow airflow through the module channel 116 and/or through the pluggable body 402.

The pluggable body 402 includes an inner wall 416 and an outer wall 418. The outer wall 418 may be a top wall. The pluggable module 400 is mated with the inner housing 210. For example, the pluggable module 400 is coupled to the extension 223 of the inner housing 210. The module circuit board 404 is plugged into the first slot 220. The outer housing 240 is recessed relative to the inner housing 210 to provide a space for receiving the outer wall 418 of the pluggable body 402 in slot 116. As such, the communication connector 200 is configured to be coupled to conventional pluggable modules 400.

Figure 19:
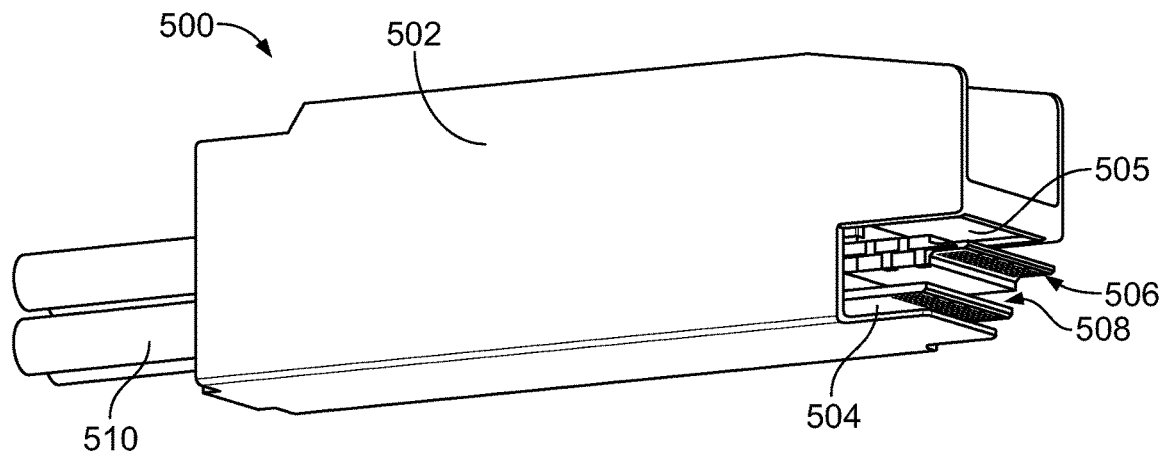
FIG. 19 is a perspective view of a pluggable module in accordance with an exemplary embodiment.
Figure 20:
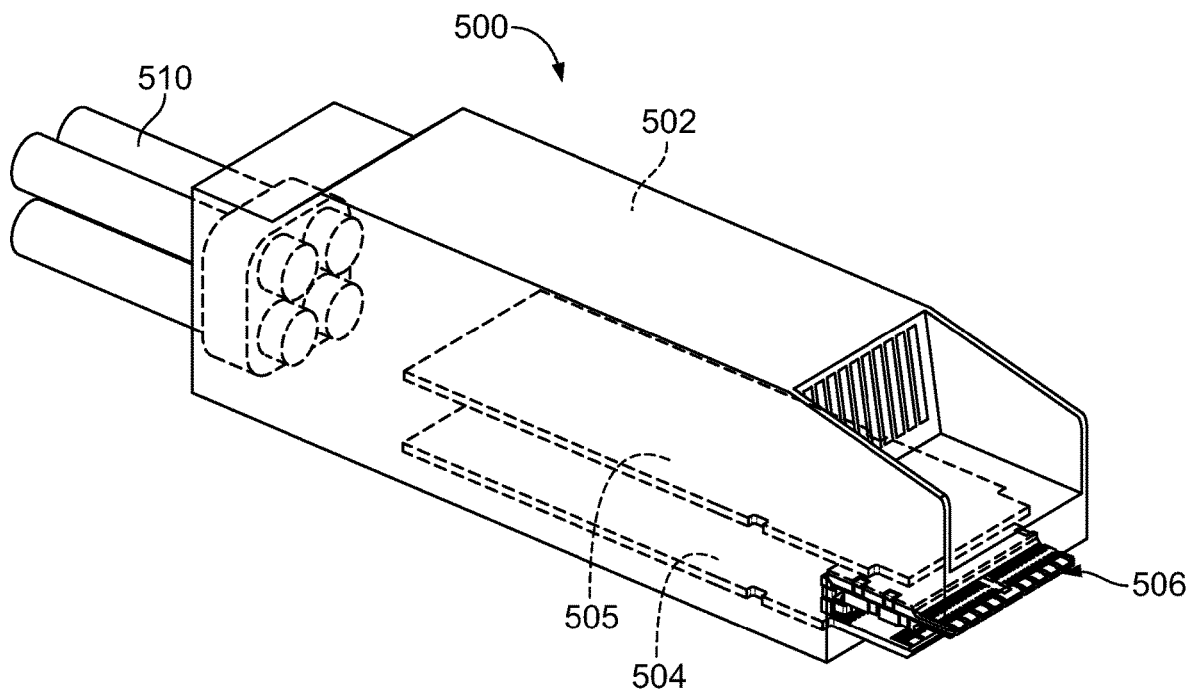
FIG. 20 is a perspective view of a pluggable module in accordance with an exemplary embodiment.

FIG. 19 is a perspective view of a pluggable module 500 in accordance with an exemplary embodiment. FIG. 20 is a perspective view of a pluggable module 500 in accordance with an exemplary embodiment with a portion of the pluggable module 500 in phantom to illustrate internal components of the pluggable module 500. The pluggable module 500 is similar to the pluggable module 300 (shown in FIG. 1); however, the pluggable module 500 includes two separate module circuit boards rather than a single module circuit board.

The pluggable module 500 includes a pluggable body 502 that holds a first module circuit board 504 and a second module circuit board 505. The pluggable module 500 includes a plug connector 506 coupled to the second module circuit board 505. The module circuit boards 504, 505 and the plug connector 506 are arranged in a module cavity 508 of the pluggable body 502. The pluggable body 502 is configured to be plugged into the module channel 116 (FIG. 1) of the receptacle cage 110 (FIG. 1) for mating with the communication connector 200 (FIG. 3). The module circuit board 504 is mated with the inner receptacle connector 202 (FIG. 3) and the plug connector 506 is mated with the outer receptacle connector 204 (FIG. 3). The plug connector 506 is similar to the plug connector 306 (FIG. 10). In the illustrated embodiment, the plug connector 506 extends from a bottom of the second module circuit board 505. In an exemplary embodiment, cables 510 extend from the pluggable body 502. Multiple cables 510 may be provided. The cables 510 are terminated to corresponding module circuit boards 504, 505.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "second," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A communication system comprising:
a receptacle connector assembly including a receptacle cage configured to be mounted to a circuit board and a communication connector configured to be mounted to the circuit board, the receptacle cage having walls defining a cavity including at least one module channel, the communication connector received in the cavity, the communication connector having an inner receptacle connector and an outer receptacle connector, the inner receptacle connector located between the outer receptacle connector and the circuit board, the inner receptacle connector having an inner housing holding an inner contact array of inner contacts, the outer receptacle connector having an outer housing holding an outer contact array of outer contacts, the inner receptacle connector having an inner mating interface and an inner mounting interface perpendicular to the inner mating interface configured to be mounted to the circuit board, the outer receptacle connector having an outer mating interface and an outer mounting interface perpendicular to the outer mating interface configured to be mounted to the circuit board; and
a pluggable module received in the cavity of the receptacle cage to mate with the communication connector, the pluggable module including a pluggable body extending between a cable end and a mating end rearward of the cable end, the pluggable body defining a module cavity, the pluggable module including a module circuit board received in the module cavity, the module circuit board having mating pads at a mating edge of the module circuit board, the mating edge being plugged into the inner receptacle connector to mate the mating pads with the inner contacts of the inner receptacle connector, the module circuit board having connector pads at a mounting location remote from the mating edge, the pluggable module including a plug connector extending between a plug mating end and a plug mounting end, the plug mounting end mounted to the module circuit board at the mounting location, the plug connector including plug contacts extending between the plug mating end and the plug mounting end, the plug mating end being plugged into the outer receptacle connector to mate the plug contacts with the outer contacts of the outer receptacle connector.

2. The communication system of claim 1, wherein the outer mating interface is recessed relative to the inner mating interface rearward of the inner mating interface, the plug mating end extending rearward of the mating edge of the module circuit board for mating with the outer mating interface.

3. The communication system of claim 1, wherein the plug connector includes a platform extending to a platform edge at the plug mating end, the platform oriented parallel to and spaced apart from the module circuit board, the plug contacts extending along the platform to the platform edge, the platform edge being plugged into the outer housing to mate the plug contacts with the outer contacts.

4. The communication system of claim 3, wherein the platform includes an inner surface and an outer surface opposing the inner surface, the inner surface facing the module circuit board, the plug contacts extending along the inner surface and the outer surface.

5. The communication system of claim 1, wherein the plug connector includes an inner contact assembly and an outer contact assembly with a ground plate between the inner contact assembly and the outer contact assembly, the inner contact assembly including a dielectric inner frame holding inner plug contacts of the plug contacts, the outer contact assembly including a dielectric outer frame holding outer plug contacts of the plug contacts.

6. The communication system of claim 1, wherein the outer housing is separate and discrete from the inner housing, the outer housing being coupled to the inner housing.

7. The communication system of claim 1, wherein the inner housing includes a first slot receiving the mating edge of the module circuit board, the outer housing including a second slot receiving the plug mating end of the plug connector.

8. The communication system of claim 1, wherein the cage includes a separating wall in the cavity between a first module channel and a second module channel of the at least one module channel, the communication connector being a first communication connector aligned with the first module channel, the receptacle connector assembly further comprising a second communication connector identical to the first communication connector, the second communication connector aligned with the second module channel, the communication system further comprising a second pluggable module received in the second module channel and mated with the second communication connector.

9. The communication system of claim 1, wherein the receptacle connector assembly is an upper receptacle connector assembly configured to be mounted to an upper surface of the circuit board, the communication system further comprising a lower receptacle connector assembly configured to be mounted to a lower surface of the circuit board, the lower receptacle connector assembly being aligned with the upper receptacle connector assembly.

10. The communication system of claim 1, wherein the pluggable module includes a second mounting location and a second plug connector coupled to the second mounting location, the receptacle connector assembly including a second communication connector, the module circuit board being plugged into the second communication connector and the second plug connector being plugged into the second communication connector.

11. A receptacle connector assembly comprising:
a receptacle cage including a plurality of walls defining a cavity extending between a front and a rear of the receptacle cage, the walls including an inner wall and an outer wall opposite the inner wall, the walls including a first side wall and a second side wall, the inner wall configured to be mounted to a circuit board; and
a communication connector received in the cavity and configured to be mounted to the circuit board, the communication connector including an inner receptacle connector and an outer receptacle connector, the inner receptacle connector located between the outer receptacle connector and the circuit board, the inner receptacle connector having an inner housing holding an inner contact array of inner contacts, the inner receptacle connector having an inner mating interface and an inner mounting interface perpendicular to the inner mating interface configured to be mounted to the circuit board, the inner housing having a first slot at the first mating interface, the outer receptacle connector having an outer housing holding an outer contact array of outer contacts, the outer receptacle connector having an outer mating interface and an outer mounting interface perpendicular to the outer mating interface configured to be mounted to the circuit board, the outer housing having a second slot at the second mating interface, the inner mating interface and the outer mating interface being positioned relative to each other for mating with a common pluggable module;
wherein the first slot is configured to receive a mating edge of a module circuit board of a pluggable module and the second slot is configured to receive a plug mating end of a plug connector of the pluggable module mounted to and extending from the module circuit board.

12. The receptacle connector assembly of claim 11, wherein the outer receptacle connector is recessed relative to the inner receptacle connector such that the outer mating interface is located rearward of and outward of the inner mating interface.

13. The receptacle connector assembly of claim 11, wherein the outer housing is separate and discrete from the inner housing, the outer housing being coupled to the inner housing.

14. The receptacle connector assembly of claim 11, wherein the cage includes a separating wall in the cavity between a first module channel and a second module channel, the communication connector being a first communication connector aligned with the first module channel, the receptacle connector assembly further comprising a second communication connector identical to the first communication connector, the second communication connector aligned with the second module channel for mating with a second pluggable module received in the second module channel.

15. A pluggable module comprising:
a pluggable body extending between a cable end and a mating end rearward of the cable end, the pluggable body having a module cavity;
a module circuit board received in the module cavity, the module circuit board having a first surface and a second surface extending between a cable end and a mating end rearward of the cable end, the module circuit board having a mating edge at the mating end configured to be plugged into a first slot of a communication connector, the module circuit board having mating pads at the mating edge of the module circuit board on at least one of the first surface or the second surface, the mating pads configured to be mated with inner contacts of the communication connector when the mating edge is plugged into the first slot of the communication connector, the module circuit board having connector pads at a mounting location on the first surface remote from the mating edge; and
a plug connector coupled to the module circuit board, the plug connector extending between a plug mating end and a plug mounting end, the plug mounting end being mounted to the module circuit board at the mounting location, the plug connector including plug contacts extending between the plug mating end and the plug mounting end, the plug mating end configured to be plugged into a second slot of the communication connector to mate the plug contacts with outer contacts of the communication connector.

16. The pluggable module of claim 15, wherein the plug mating end extends rearward of the mating edge of the module circuit board for mating with the communication connector.

17. The pluggable module of claim 15, wherein the plug connector includes a platform extending to a platform edge at the plug mating end, the platform oriented parallel to and spaced apart from the module circuit board, the plug contacts extending along the platform to the platform edge, the platform edge configured to be plugged into the second slot of the communication connector.

18. The pluggable module of claim 17, wherein the platform includes an inner surface and an outer surface opposing the inner surface, the inner surface facing the module circuit board, the plug contacts extending along the inner surface and the outer surface.

19. The pluggable module of claim 15, wherein the plug connector includes an inner contact assembly and an outer contact assembly with a ground plate between the inner contact assembly and the outer contact assembly, the inner contact assembly including a dielectric inner frame holding inner plug contacts of the plug contacts, the outer contact assembly including a dielectric outer frame holding outer plug contacts of the plug contacts.

20. A pluggable module comprising:
a pluggable body extending between a cable end and a mating end rearward of the cable end, the pluggable body having a module cavity;
a first module circuit board received in the module cavity, the first module circuit board having a first surface and a second surface extending between a cable end and a mating end rearward of the cable end, the first module circuit board having a mating edge at the mating end configured to be plugged into a first slot of a communication connector;
a second module circuit board received in the module cavity, the second module circuit board having a first surface and a second surface extending between a cable end and a mating end rearward of the cable end, the second module circuit board having connector pads at a mounting location on the second surface; and
a plug connector coupled to the second module circuit board at the mounting location, the plug connector extending between a plug mating end and a plug mounting end, the plug mounting end being mounted to the second module circuit board at the mounting location, the plug connector including plug contacts extending between the plug mating end and the plug mounting end, the plug mating end configured to be plugged into a second slot of the communication connector to mate the plug contacts with outer contacts of the communication connector.

21. The pluggable module of claim 20, wherein the plug connector is located between the first module circuit board and the second module circuit board.

* * * * *